(12) United States Patent
Kwag et al.

(10) Patent No.: US 10,096,633 B2
(45) Date of Patent: Oct. 9, 2018

(54) TRANSISTOR AND IMAGE SENSOR HAVING THE SAME

(71) Applicant: SK hynix Inc., Gyeonggi-do (KR)

(72) Inventors: Pyong-Su Kwag, Gyeonggi-do (KR);
Min-Ki Na, Gyeonggi-do (KR);
Dong-Hyun Woo, Gyeonggi-do (KR);
Ho-Ryeong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/192,816

(22) Filed: Jun. 24, 2016

(65) Prior Publication Data

US 2017/0278883 A1   Sep. 28, 2017

(30) Foreign Application Priority Data

Mar. 25, 2016   (KR) .................. 10-2016-0035855

(51) Int. Cl.
*H01L 31/062*   (2012.01)
*H01L 27/146*   (2006.01)
*H01L 27/06*   (2006.01)
*H01L 29/423*   (2006.01)

(52) U.S. Cl.
CPC .... *H01L 27/14614* (2013.01); *H01L 27/0629* (2013.01); *H01L 27/14643* (2013.01); *H01L 27/14689* (2013.01); *H01L 29/42376* (2013.01)

(58) Field of Classification Search
CPC ......... H01L 27/15614; H01L 27/14614; H01L 27/14643; H01L 27/14689; H01L 27/0629; H01L 29/42376

USPC ........................................................ 257/292
See application file for complete search history.

(56) References Cited

U.S. PATENT DOCUMENTS

| | | | |
|---|---|---|---|
| 7,432,540 B2 | 10/2008 | McKee | |
| 2008/0054319 A1* | 3/2008 | Mouli | H01L 27/14609 257/292 |
| 2011/0108837 A1* | 5/2011 | Yamazaki | H01L 29/24 257/43 |
| 2013/0009135 A1* | 1/2013 | Katsuhara | H01L 51/0562 257/40 |
| 2013/0162859 A1* | 6/2013 | Wayama | H01L 27/14806 348/222.1 |
| 2017/0125482 A1* | 5/2017 | Izumida | H01L 27/2454 |

\* cited by examiner

*Primary Examiner* — Vongsavanh Sengdara
(74) *Attorney, Agent, or Firm* — IP & T Group LLP

(57) ABSTRACT

An image sensor includes: a light receiving section suitable for generating photocharges in response to incident light; and a driving section including a source follower transistor suitable for generating an output voltage corresponding to a reference voltage in response to the photocharges. The source follower transistor includes: a stack structure formed by sequentially stacking a first conductive layer, an insulating layer and a second conductive layer; an open portion formed through the second conductive layer and the insulating layer so as to expose the first conductive layer; a channel layer formed along the surface of the open portion so as to be connected to the first conductive layer and the second conductive layer; and a gate is connected to the light receiving section and which is formed over the channel layer so as to overlap the second conductive layer.

11 Claims, 5 Drawing Sheets

TRANSISTOR AND IMAGE SENSOR HAVING THE SAME

CROSS-REFERENCE TO RELATED APPLICATIONS

The present application claims priority under 35 U.S.C. § 119(a) of Korean Patent Application No. 10-2016-0035855, entitled "TRANSISTOR AND IMAGE SENSOR HAVING THE SAME" and filed on Mar. 25, 2016, which is incorporated herein by reference in its entirety.

BACKGROUND

Exemplary embodiments of the present invention relate to semiconductor device fabrication technology and, more particularly, to a transistor and an image sensor including the same.

An image sensor converts an optical image into an electrical signal. Due to recent developments in the computer and communication industries, demand has increased for an improved image sensor which is suitable for various devices, such as digital cameras, camcorders, Personal Communication System (PCS), game machines, security cameras, medical micro-cameras, and robots.

SUMMARY

Embodiments of the present invention are directed to a transistor having improved performance and an image sensor including the same.

In accordance with an embodiment of the present invention, an image sensor includes: a light receiving section suitable for generating photocharges in response to incident light; and a driving section including a source follower transistor suitable for generating an output voltage corresponding to a reference voltage in response to the photocharges. The source follower transistor includes: a stack structure formed by sequentially stacking a first conductive layer, an insulating layer and a second conductive layer; an open portion formed through the second conductive layer and the insulating layer so as to expose the first conductive layer; a channel layer formed along the surface of the open portion so as to be connected to the first conductive layer and the second conductive layer; and a gate is connected to the light receiving section and which is formed over the channel layer so as to overlap the second conductive layer.

The driving section may include a floating diffusion composed of the second conductive layer and the gate overlapping the second conductive layer. The light receiving section may include a photoelectric conversion element configured to generate the photocharges in response to incident light; a transfer transistor configured to transfer the photocharges to the floating diffusion in response to a transfer signal; and a reset transistor configured to reset the floating diffusion in response to a reset signal.

The gate may include a gate insulating layer formed over the channel layer; and a gate electrode formed over the gate insulating layer such that it fills the open portion and a portion thereof is formed over the second conductive layer. The reference voltage may be applied to the second conductive layer. The first conductive layer and the second conductive layer may be of a conductivity type different from that of the channel layer. The channel layer may include one of undoped polysilicon or P-type polysilicon. The first conductive layer and the second conductive layer may be of the same conductivity type as that of the channel layer. The channel layer may include N-type polysilicon.

In accordance with another embodiment of the present invention, a transistor includes: a stack structure formed by sequentially stacking a first conductive layer, an insulating layer and a second conductive layer; an open portion formed in the second conductive layer and the insulating layer so as to expose the first conductive layer; a channel layer formed along the surface of the open portion so as to be connected to the first conductive layer and the second conductive layer; and a gate formed cm the channel layer and including a first region, formed in the open portion, and a second region overlapping the second conductive layer.

The second conductive layer and the second region of the gate may form a capacitor. The gate may include a gate insulating layer formed over the channel layer; and a gate electrode formed over the gate insulating layer such that it fills the open portion and a portion thereof is formed over the second conductive layer. The first conductive layer and the second conductive layer may be of a conductivity type different from that of the channel layer. The channel layer may include one of undoped polysilicon or P-type polysilicon. The first conductive layer and the second conductive layer may be of the same conductivity type as that of the channel layer. The channel layer may include N-type polysilicon.

In accordance with the other embodiment of the present invention, a method for manufacturing a transistor includes: forming a stack structure by sequentially stacking a first conductive layer, an insulating layer and a second conductive layer; forming an open portion through the second conductive layer and the insulating layer so as to expose the first conductive layer; forming a channel layer along a surface of the open portion so as to be connected to the first conductive layer and the second conductive layer; and forming a gate over the channel layer, including a first region, formed in the open portion, and a second region overlapping the second conductive layer.

The second conductive layer and the second region of the gate may form a capacitor. The gate may include a gate insulating layer formed over the channel layer; and a gate electrode formed over the gate insulating layer such that it fills the open portion and a portion thereof is formed over the second conductive layer. The first conductive layer and the second conductive layer may be of a conductivity type different from that of the channel layer, or may be of the same conductivity type as that of the channel layer.

DETAILED DESCRIPTION

Figure 1:
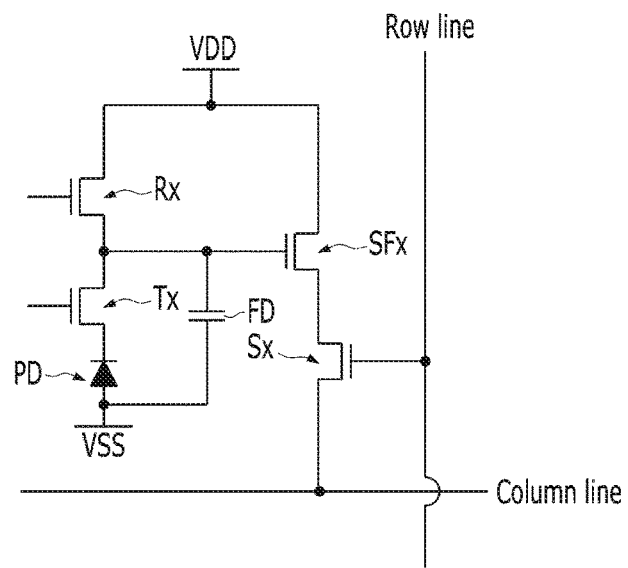
FIG. 1 is an equivalent circuit diagram of a pixel in an image sensor according to a comparative example.

Various embodiments of the present invention are described below as examples with reference to accompanying drawings.

The drawings are not drawn necessarily to scale and in some instances, proportions of at least some of structures in the drawings have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Embodiments of the present invention provide a transistor having improved performance and an image sensor including the same. As used herein, the phrase "transistor having improved performance" may refer, inter alia, to a transistor capable of forming a capacitor using a parasitic capacitance between a gate and a drain without requiring a separate additional process and additional area. In addition, the term "image sensor having improved performance" may refer, inter alia, to an image sensor capable of providing a floating diffusion using the above-described transistor without requiring a separate additional process and additional area.

An image sensor converts an optical signal into an electrical signal. An image sensor is typically a Charge-Coupled Device (CCD) or a complementary metal-oxide-semiconductor (CMOS) Image Sensor (CIS). A CIS has advantages in that it is driven in a simple way and can be fabricated at reduced costs by CMOS process technology. A CIS includes a pixel array having a plurality of pixels arranged in a matrix form. Each of the pixels typically includes a photoelectric conversion element that generates photocharges from incident light, and an output circuit that outputs an image signal in response to the generated photocharges. A typical output circuit includes four pixel transistors.

An example of a pixel, which includes a photoelectric conversion element and an output circuit with four pixel transistors, will now be described with reference to FIG. 1.

FIG. 1 is an equivalent circuit diagram of a pixel in an image sensor according to a comparative example.

As shown in FIG. 1, the pixel of the image sensor according to the comparative example may include a photoelectric conversion element PD, a transfer transistor Tx, a reset transistor Rx, a source follower transistor SFx, and a selection transistor Sx.

The photoelectric conversion element PD is a photodiode connected between a second node set to a ground voltage VSS and the transfer transistor Tx. The reset transistor Rx may be connected between the transfer transistor Tx and a first node set to a power supply voltage VDD. A floating diffusion FD may be connected between the reset transistor Rx and the second node, in parallel with the serially connected transfer transistor Tx and photoelectric conversion element PD. The gate of the source follower transistor SFx may be connected to the floating diffusion FD. One side of the source follower transistor SFx may be connected to the first node, and the other side of the source follower transistor SFx may be connected to the selection transistor Sx. The gate of the selection transistor Sx may be connected to a row line extending from a row driver (not shown), and the selection transistor Sx may be connected to a column line.

The pixel of the image sensor may operate as follows. In response to a selection signal applied from the row driver through the row line, selection transistor Sx is turned on for selecting the pixel. Then in a state in which incident light incoming into the photoelectric conversion element PD is blocked, the reset transistor Rx is turned on to reset the floating diffusion FD. Then, the reset transistor Rx is turned off, and incident light is irradiated on the photoelectric conversion element PD for a certain period of time, known as an integration time, to generate photocharges. After the integration time elapses, the transfer transistor Tx is turned on for transferring the generated photocharges to the floating diffusion FD where they are stored. The gate bias of the source follower transistor SFx is changed in proportion to the amount of the stored photocharges, and an image signal that is an output voltage corresponding to the power supply voltage VDD is output to the column line in response to the amount of the photocharges stored in the floating diffusion FD.

In the described conventional image sensor, increasing the integration density of the image sensor requires reducing the size of each pixel including the area of the floating diffusion FD in the pixel, making it difficult to ensure sufficient capacitance. Particularly, in a three-dimensional structure in which the photoelectric conversion element PD and the pixel transistors, such as the transfer transistor Tx and the reset transistor Rx are vertically stacked in order to prevent the fill factor from decreasing due to an increase in the integration density, it is even more difficult to ensure the capacitance of the floating diffusion FD.

The following described embodiments of the present invention provide an improved transistor capable of providing a floating diffusion having sufficient capacitance without requiring a separate additional process and an additional area, and an image sensor including the transistor.

Figure 2:
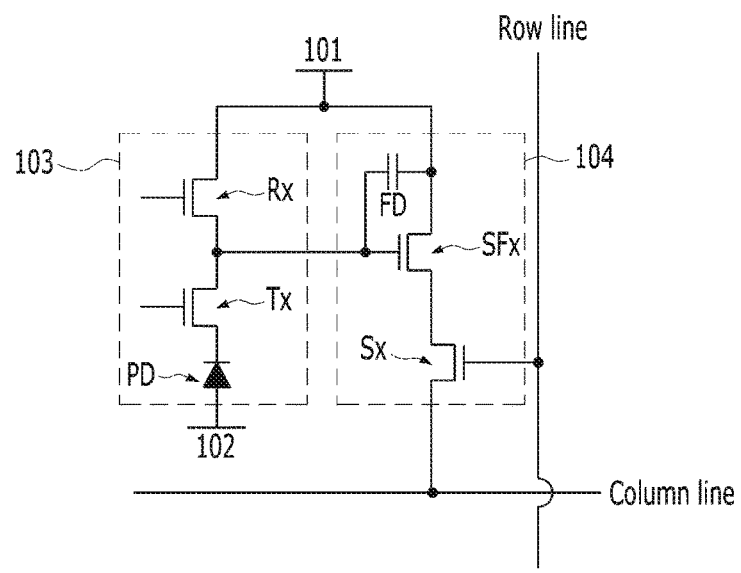
FIG. 2 is an equivalent circuit diagram of a pixel in an image sensor, according to an embodiment of the present invention.

FIG. 2 is an equivalent circuit diagram of a pixel in an image sensor, according to an embodiment of the present invention.

As shown in FIG. 2, the image sensor may include a light receiving section 103 and a driving section 104. Specifically, the light receiving section 103 may be connected between a first node 10 set to a first voltage and a second node 102 set to a second voltage, and may generate photocharges in response to incident light. The first voltage may be a power supply voltage VDD, and the second voltage may be a ground voltage VSS. The driving section 104 may transfer an output voltage corresponding to the first voltage to a column line in response to photocharges supplied from the light-receiving section 103.

The light receiving section 103 connected between the first node 101 and the second node 102 may include: a photoelectric conversion element PD configured to generate photocharges in response to incident light; a transfer transistor Tx configured to transfer the generated photocharges to a floating diffusion FD in response to a transfer signal; and a reset transistor Rx configured to reset the floating diffusion FD in response to a reset signal.

The transfer transistor Tx and the reset transistor Rx may be of any type, and may have various suitable structures which are known in the art. The transfer transistor Tx and the reset transistor Rx may each have a planar type gate structure. The transfer transistor Tx and the reset transistor Rx may have a multi-channel gate structure including a recess gate, a pin gate or the like. The transfer transistor Tx and the reset transistor Rx may have a three-dimensional structure including a vertical channel. The transfer transistor Tx and the reset transistor Rx may be a thin film transistor (TFT). The transfer signal and the reset, signal may be applied to the gate of the transfer transistor Tx and the gate of the reset transistor Rx, respectively, according to well-known processes.

The photoelectric conversion element PD may be any suitable photoelectric conversion element. For example, the photoelectric conversion element PD may be include an organic photodiode. For another example, the photoelectric conversion element PD may be include an inorganic photodiode. The photoelectric conversion element PD may be connected between the second node 102 and the transfer transistor Tx. The reset transistor Rx may be connected between the transfer transistor Tx and the first node 101. The floating diffusion FD and the gate (e.g., 160 in FIGS. 3 and 4) of the source follower transistor SFx may be connected to the connection node between the reset transistor Rx and the transfer transistor Tx.

The driving section 104 may include: the floating diffusion FD that stores photocharges generated in the light receiving section 103; the source follower transistor SFx; and the selection transistor Sx. Generally, the floating diffusion FD is composed of either an impurity region formed by implanting specific impurities into a substrate (e.g., 100 in FIG. 3) or a conductive layer formed on a specific structure. The floating diffusion FD in the image sensor according to the embodiment of the present invention may be provided using a parasitic capacitor between the gate and drain of the source follower transistor SFx without requiring a separate additional process and a separate additional area. This will be described in detail below with reference to FIGS. 3 and 4.

The source follower transistor SFx may be configured to generate an output voltage corresponding to a reference voltage or power supply voltage VDD in response to the photocharges generated in the light receiving section 103. In addition, the source follower transistor SFx may also be configured to provide the floating diffusion FD. The drain of the source follower transistor SFx may be connected to the first node 101, and the source of the source follower transistor SFx may be connected to the selection transistor Sx. The gate of the source follower transistor SFx may be connected to the connection node between the transfer transistor Tx and the reset transistor Rx in the light receiving section 103.

The selection transistor Sx may be connected between the source follower transistor SFx and the column line and the gate of the selection transistor Sx may be connected to the row line. The selection transistor Sx may be configured to transfer the output voltage, generated in the source follower transistor SFx, to the column line in response to a selection signal applied through the row line. The selection transistor Sx in the image sensor may be of any type, and may have various structures known in the art. For example, the selection transistor Sx may include the structure of a planar type gate, the structure of a multi-channel gate, or a three-dimensional gate including a vertical channel. The selection transistor Sx may be a thin film transistor (TFT).

As described above, the pixel in the image sensor according to the embodiment of the present invention dearly differs from that of the typical image sensor with respect to the connection structure of the floating diffusion FD. Hereinafter, the source follower transistor SFx including the floating diffusion FD according to the embodiment of the present invention will be described in detail with reference to FIGS. 3 and 4 together with FIG. 2.

Figure 3:
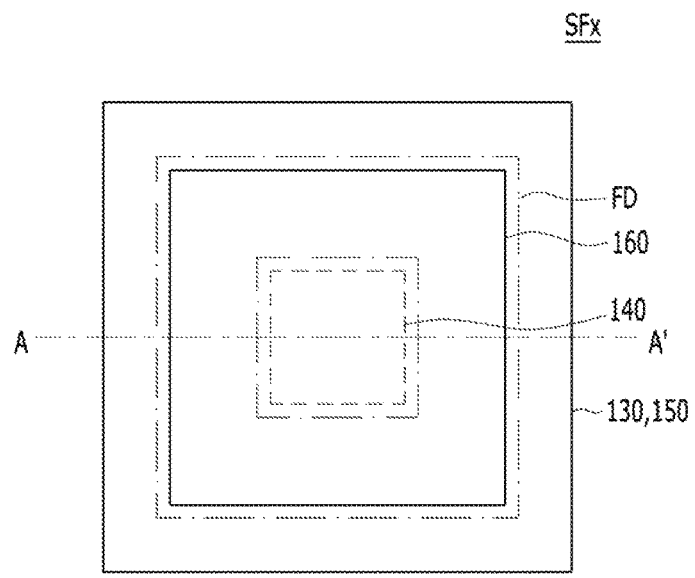
FIG. 3 is a top view of a simplified schematic illustrating a source follower transistor in an image sensor, according to an embodiment of the present invention.
Figure 4:
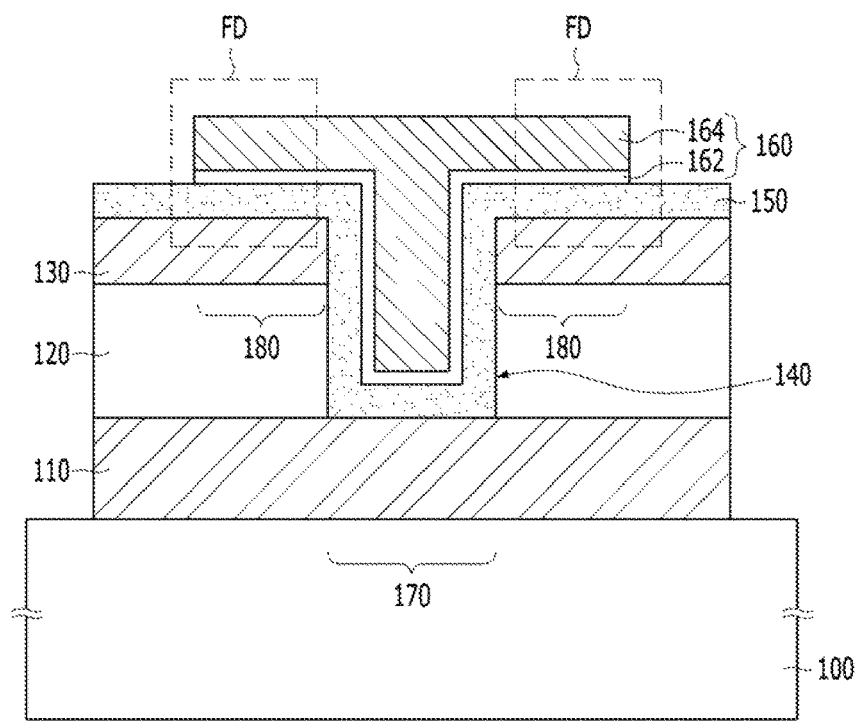
FIG. 4 is a cross-sectional view taken along line A-A' of FIG. 3.

FIG. 3 is a top view illustrating the source follower transistor in the image sensor, according to an embodiment of the present invention, and FIG. 4 is a cross-sectional view taken along line A-A' of FIG. 3.

Referring to FIGS. 2 to 4, the source follower transistor SFx of the image sensor according to the embodiment of the present invention may include a substrate 100 including a certain structure (e.g., a light receiving section 103). A stack structure is formed on the substrate 100 by sequentially stacking a first conductive layer 110, an insulating layer 120 and a second conductive layer 130. An open portion 140 is formed in the second conductive layer 130 and the insulating layer 120 so as to expose the first conductive layer 110. A channel layer 150 is formed along the surface of the open portion 140 and connected to the first conductive layer 110 and the second conductive layer 130. A gate 160 includes a first region 170, formed on the channel layer 150 and formed in the open portion 140, and a second region 180 overlapping the second conductive layer 130. Herein, the second conductive layer 130 and the second region 180 of the gate 160, which overlap the second conductive layer 130, may form a capacitor which can act as the floating diffusion FD.

The first conductive layer 110 and the second conductive layer 130 may act as a source and a drain, respectively, in the source follower transistor SFx. Namely, the selection transistor Sx may be connected to the first conductive layer 110 acting as the source, and the first node 101 may be connected to the second conductive layer 130 acting as the drain. Thus, a reference voltage or power supply voltage VDD may be applied to the second conductive layer 130. The first conductive layer 110 and the second conductive layer 130 may include a semiconductor material or a metallic material. For example, the semiconductor material includes a silicon-containing material. The silicon-containing material may include single-crystal silicon or polysilicon. Herein, the single-crystal silicon or the polysilicon may be one doped with an N-type impurity, such as, phosphorus (P) or arsenic (As). For example, the first conductive layer 110 and the second conductive layer 130 may include N-type polysilicon.

The insulating layer 120 is interposed between the first conductive layer 110 and the second conductive layer 130 may serve to isolate between the two conductive layers 110 and 130 while providing a channel length required for the source follower transistor SFx. Herein, the channel length may be controlled by controlling the thickness of the insulating layer 120. The layer 120 may insulating include one or more selected from the group consisting of oxide, nitride and oxynitride.

The open portion 140 formed through the second conductive layer 130 and the insulating layer 120 to expose the first conductive layer 110 through the bottom thereof serves to provide a space in which the channel layer 150 and the gate 160 are to be formed. The planar shape of the open portion 140 may be selected from among polygonal shapes, including a triangular shape, a circular shape, or an oval shape. Meanwhile, although the embodiment of the present invention illustrates the case in which one open portion 140 is formed, a plurality of open portions 140 may also be formed. As the number of the open portions 140 increases, the contact resistance between the first conductive layer 110 and the channel layer 150 may advantageously decrease, and the effect of increasing the channel width of the source follower transistor SFx can be obtained.

The channel layer 150 may be configured to connect the first conductive layer 110 and the second conductive layer 130 to each other in response to a voltage applied to the gate 160, that photocharges generated in the light receiving section 103. Between the gate 160 and the overlapping structure, the channel layer 150 may be interposed. For example, the channel layer 150 may be formed on the side and bottom surfaces of the open portion 140, and a portion thereof may extend onto the second conductive layer 130 so as to completely overlap the second conductive layer 130. The channel layer 150 may have a uniform thickness along the surface of the structure including the open portion 140.

The channel layer 150 may include a silicon-containing material. The silicon-containing material may include polysilicon. For example, the channel layer 150 may be formed of any one selected from among impurity-undoped polysilicon, P-type polysilicon doped with a P-type impurity, such as, boron (B), and N-type polysilicon doped with an N-type impurity, such as, phosphorus (P) or to arsenic (As). The channel layer 150 may be of a conductivity type different from that of the first conductive layer 110 and the second conductive layer 130. Specifically, if the channel layer 150 includes undoped polysilicon or P-type polysilicon, the source follower transistor SFx may operate in enhancement mode where the channel in an off-state is maintained in an inactivated state. On the contrary, the channel layer 150 may be of the same conductivity as that of the first conductive layer 110 and the second conductive layer 130. Specifically if the channel layer 150 includes N-type polysilicon the source follower transistor SFx may operate in depletion mode where the channel in an off-state is maintained in an activated state.

The gate 160 may include a gate insulating layer 162 and a gate electrode 164. The gate insulating layer 162 may be formed on the channel layer 150 so as to have a uniform thickness along the surface of the structure. The gate insulating layer 162 may include one or more selected from the group consisting of oxide, nitride and oxynitride. The gate electrode 164 may be formed so that it fills the open portion 140 while a portion thereof is formed over the second conductive layer 130. The gate electrode 164 may include a semiconductor material or a metallic material.

The gate 160 may include a first region 170 formed in the open portion 140, and a second region 180 overlapping the second conductive layer 130. The first region 170 may be configured to control the on/off state of the channel layer 150 between the first conductive layer 110 and the second conductive layer 130 in response to a bias applied to the gate 160 (i.e., photocharges). In addition, the second region 180 together with the second conductive layer 130 may act as the floating diffusion (FD). Namely, the floating diffusion FD may include a capacitor including a stack of the second conductive layer 130 corresponding to the second region 180, the gate insulating layer 162 and the gate electrode 164. Herein, the capacitor that acts as the floating diffusion FD may have a capacitance ranging from 1 femto Farad (fF) to 3 fF. In other words, the area of the gate 160 overlapping the second conductive layer 130 may be controlled so that a parasitic capacitor generated by overlapping therebetween has a capacitance ranging from 1 fF to 3 fF. Thus, the source follower transistor SFx according to an embodiment of the present invention provides a floating diffusion FD using a parasitic capacitor, which is generated by partial overlapping between the second conductive layer 130 acting as the drain and the gate 160 of the source follower transistor SFx, without requiring a separate additional structure needing a separate additional area. Herein, the capacitance of the floating diffusion FD can be easily controlled by controlling the area of overlapping between the second conductive layer 130 and the gate 160.

FIGS. 5A to 5D are cross-sectional views illustrating a method for fabricating a source follower transistor in an image sensor, according to an embodiment of the present invention.

Figure 5A:
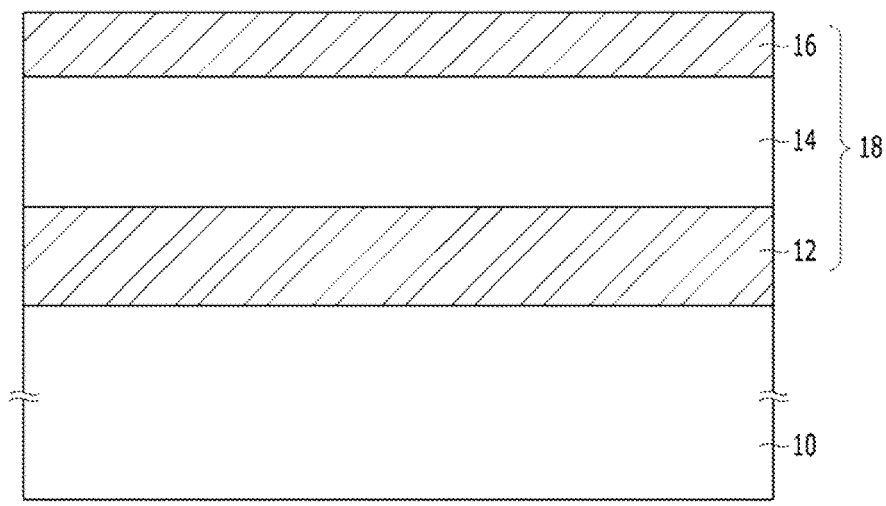
FIGS. 5A to 5D are cross-sectional views of a simplified schematic illustrating a method for fabricating a source follower transistor in an image sensor, according to an embodiment of the present invention.

As shown in FIG. 5A, a first conductive layer 12, an insulating layer 14 and a second conductive layer 16 are sequentially stacked on a substrate 10 having a certain structure formed thereon to form a multilayer structure 18. The first conductive layer 12 and the second conductive layer 16 may include a semiconductor material or a metallic material. For example, the first conductive layer 12 and the second conductive layer 16 may include a silicon-containing material. For another example, the first conductive layer 12 and the second conductive layer 16 may include single-crystal silicon or polysilicon, and the single-crystal silicon or polysilicon may be one doped with an N-type impurity. In addition, the insulating layer 14 may include one or more selected from the group consisting of oxide, nitride and oxynitride.

Figure 5B:
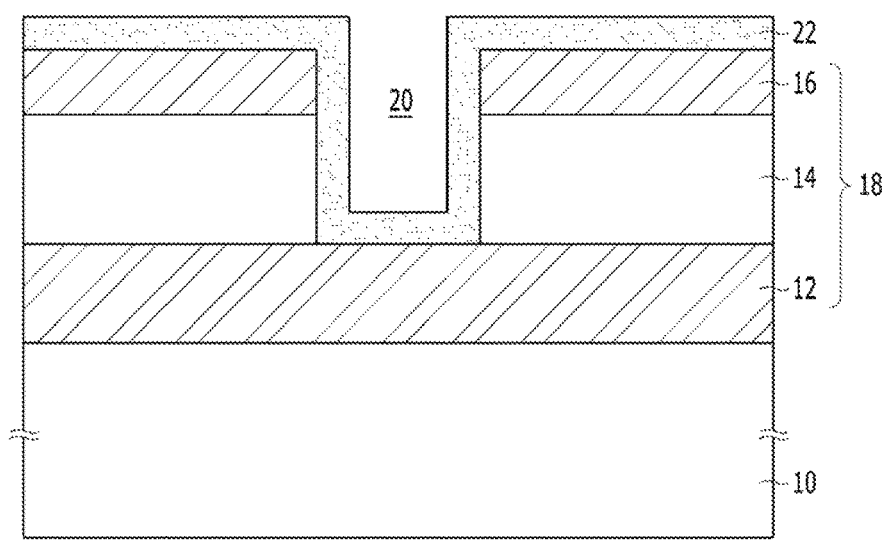

Referring to FIG. 5B, a mask pattern (not shown) is formed on the multilayer structure 18 (before forming the channel layer 22), and then the second conductive layer 16 and the insulating layer 14 are etched using the mask pattern a an etch barrier until the first conductive layer 12 is exposed, thereby forming an open portion 20. For example, the etching process for forming the open portion 20 may be performed by dry etching.

Although the illustrated embodiment shows that only one open portion 20 is formed, in another embodiment a plurality of open portions 20 may be formed.

Next, the channel layer 22 is formed along the surface of the structure including the open portion 20. The channel layer 22 may be formed to have a uniform thickness along the surface of the structure including the open portion 20. The channel layer 22 may include a semiconductor material (e.g., a silicon-containing material). For example, the channel layer 22 may include polysilicon. Herein, the channel layer 22 may be formed of any suitable material including one selected from among impurity-undoped polysilicon, P-type polysilicon doped with a P-type impurity such as boron (B), and N-type polysilicon doped with an N-type impurity, such as, phosphorus (P) or arsenic (As). The channel layer 22 may be of a conductivity type different from that of the first conductive layer 12 and the second conductive layer 16, and in this case, the source follower transistor SFx may operate in enhancement mode. On the contrary, the channel layer 22 may be of the same conductivity type as that of the first conductive layer 12 and the second conductive layer 16, and in this case, the source follower transistor SFx may operate in depletion mode.

Figure 5C:
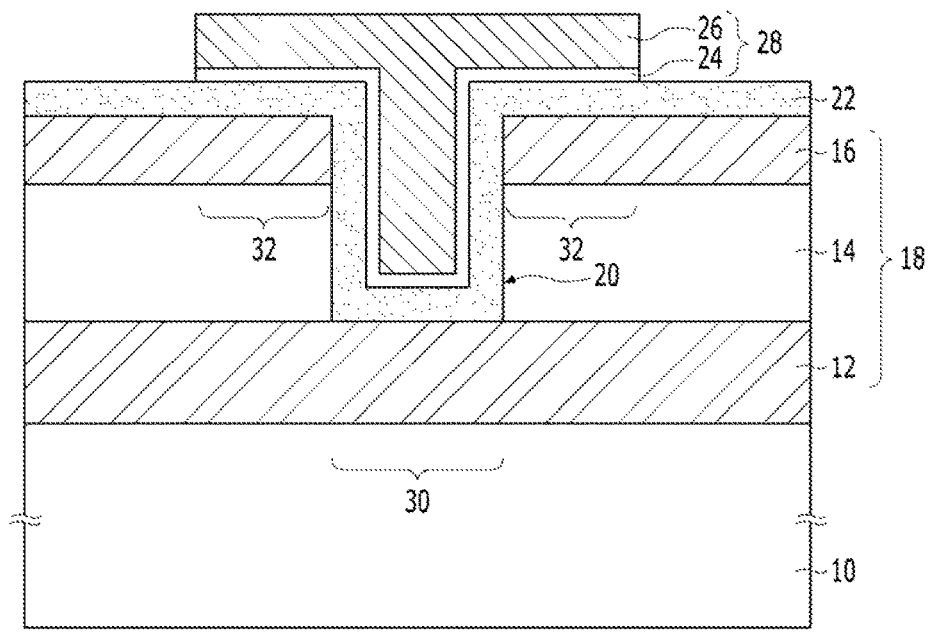

As shown in FIG. 5C, a gate insulating layer 24 is formed on the channel layer 22, and a gate electrode 26 is formed on the gate insulating layer 22 so as to fill the open portion 20 and cover the entire surface of the structure including the channel layer 22. Next, using a mask pattern (not shown) on the gate electrode 26 as an etch barrier, the gate electrode 26 and the gate insulating layer 24 are etched to form a gate 28.

The gate 28 may include a first region 30 filled in the open portion 20, and a second region 32 overlapping the second conductive layer 16. Thus, the second region 32 of the gate 28 and the second conductive layer 16 may provide a capacitor. Herein, the capacitor may include a stack of the second conductive layer 16, the gate insulating layer 24 and the gate electrode 26, and may act as a floating diffusion FD.

Figure 5D:
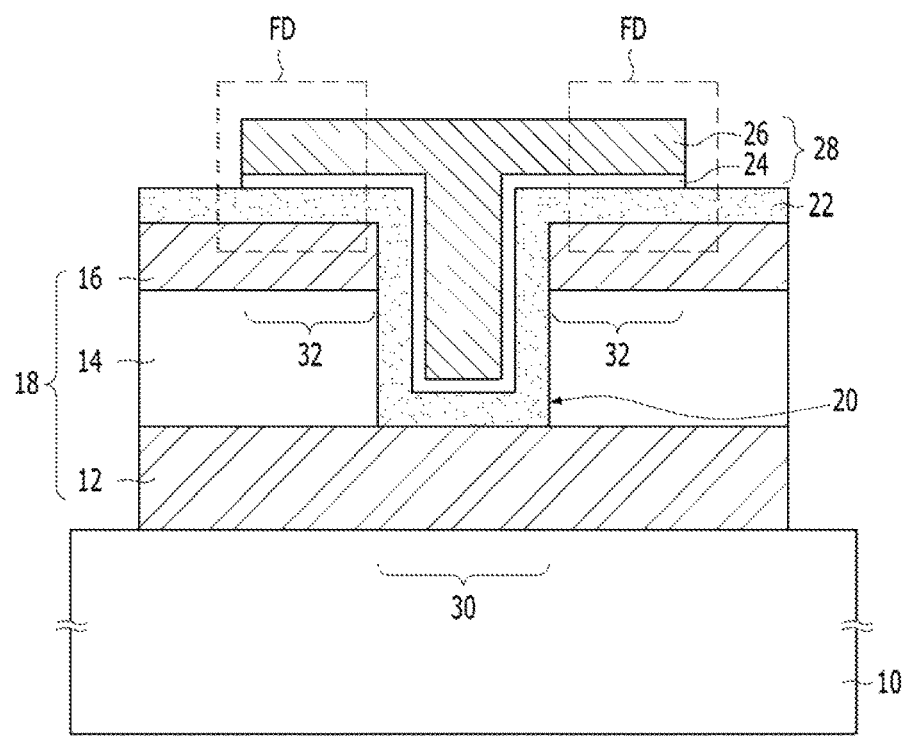

As shown in FIG. 5D, a mask pattern (not shown) is formed on the structure including the gate 28, and the channel layer 22 and the multilayer structure 18 are etched using the mask pattern as an etch barrier until the substrate 10 is exposed, thereby isolating adjacent structures from each other. The etching process may be performed by dry etching.

Thereafter, a known fabrication process may be performed, thereby fabricating an image sensor.

The image sensor in accordance with an embodiment of the present invention may be used in various electronic devices or systems. Hereafter, a camera including an image sensor in accordance with an embodiment of the present invention will be described with reference to FIG. 6.

Figure 6:
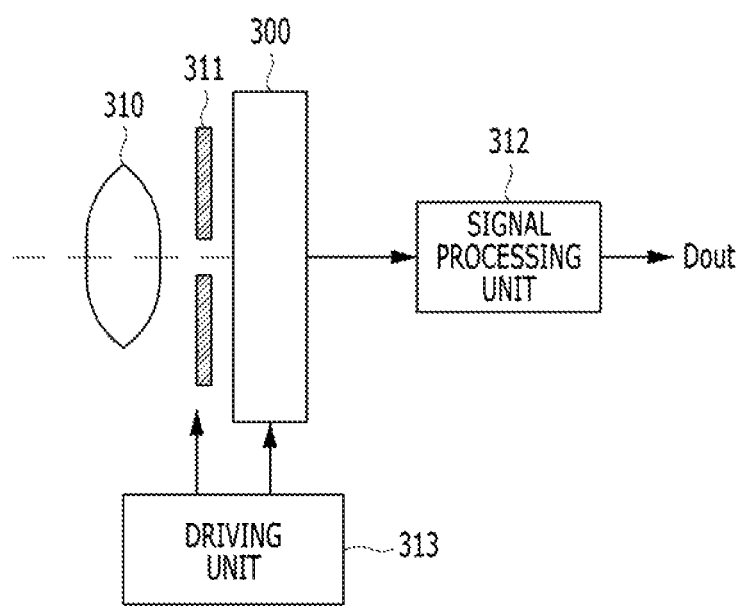
FIG. 6 is a simplified schematic diagram of an electronic device including an image sensor, according to an embodiment of the present invention.

Referring to FIG. 6, the electronic device is a camera capable of taking a still image or a moving image. The electronic device includes an image sensor 300, an optical system or optical lens 310, a shutter unit 311, a driving unit 313 for controlling/driving the image sensor 300 and the shutter unit 311, and a signal processing unit 312. The image sensor 300 in accordance with an embodiment of the present invention.

The optical system 310 may guide image light from an object to the pixel array of the image sensor 300. The optical system 310 may include a plurality of optical lenses. The shutter unit 311 may control the light irradiation period and the light shield period for the image sensor 300. The driving unit 313 may control a transmission operation of the image sensor 300 and a shutter operation of the shutter unit 311. The signal processing unit 312 may process signals outputted from the image sensor 300 in various manners. The processed image signals Dout may be stored in a storage medium, such as a memory or outputted to a monitor or the like.

As described above, according to the present invention, a floating diffusion having sufficient capacitance can be provided using a capacitor, formed by intentionally overlapping a gate with a drain, without requiring a separate additional structure or process and a separate additional area.

While the present invention has been described with respect to the specific embodiments, it will be apparent to those skilled in the art that various changes and modifications may be made without departing from the spirit and scope of the invention as defined in the following claims.

What is claimed is:

1. An image sensor comprising:
a light receiving section configured to generate photocharges in response to incident light; and
a driving section including a source follower transistor configured to generate an output voltage corresponding to a reference voltage of the image sensor in response to the photocharges,
wherein the source follower transistor comprises:
a substrate;
a stack structure formed over the substrate by sequentially stacking a first conductive layer, an insulating layer and a second conductive layer, wherein the insulating layer is interposed between the first conductive layer and the second conductive layer;
an open portion formed through the second conductive layer and the insulating layer so as to expose the first conductive layer;
a channel layer formed along a surface of the open portion so as to be connected to the first conductive layer and extending onto the second conductive layer so as to be connected to the second conductive layer; and
a gate is connected to the light receiving section and which is formed over the channel layer so as to overlap the second conductive layer.

2. The image sensor of claim 1, wherein the driving section comprises a floating diffusion composed of the second conductive layer and the gate overlapping the second conductive layer.

3. The image sensor of claim 2, wherein the light receiving section comprises:
a photoelectric conversion element configured to generate the photocharges in response to incident light;
a transfer transistor configured to transfer the photocharges to the floating diffusion in response to a transfer signal; and
a reset transistor configured to reset the floating diffusion in response to a reset signal.

4. The image sensor of claim 1, wherein the gate comprises:
a gate insulating layer formed over the channel layer; and
a gate electrode formed over the gate insulating layer such that it fills the open portion and a portion thereof is formed over the second conductive layer.

5. The image sensor of claim 1, wherein the reference voltage of the image sensor is applied to the second conductive layer.

6. The image sensor of claim 1, wherein the first conductive layer and the second conductive layer are of a conductivity type different from that of the channel layer.

7. The image sensor of claim 6, wherein the channel layer comprises one of undoped polysilicon or P-type polysilicon.

8. The image sensor of claim 1, wherein the first conductive layer and the second conductive layer are of the same conductivity type as that of the channel layer.

9. The image sensor of claim 8, wherein the channel layer comprises N-type polysilicon.

10. The image sensor of claim 1, wherein the channel length is controlled by controlling a thickness of the insulating layer.

11. An image sensor comprising:
a light receiving section configured to generate photocharges in response to incident light; and
a driving section including a source follower transistor configured to generate an output voltage corresponding to a reference voltage of the image sensor in response to the photocharges,
wherein the source follower transistor comprises:
a substrate;
a stack structure formed over the substrate by sequentially stacking a first conductive layer, an insulating layer and a second conductive layer, wherein the first conductive layer and the second conductive layer act as a source and a drain, respectively;
an open portion formed through the second conductive layer and the insulating layer so as to expose the first conductive layer;
a channel layer formed along a surface of the open portion so as to be connected to the first conductive layer and extending onto the second conductive layer so as to be connected to the second conductive layer; and a gate is connected to the light receiving section and which is formed over the channel layer so as to overlap the second conductive layer.

\* \* \* \* \*